United States Patent
Takano et al.

(10) Patent No.: US 8,048,358 B2
(45) Date of Patent: Nov. 1, 2011

(54) POP SEMICONDUCTOR DEVICE MANUFACTURING METHOD

(75) Inventors: Kiyoharu Takano, Oita (JP); Makoto Yoshino, Beppu (JP); Yoshimi Takahashi, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 26 days.

(21) Appl. No.: 12/566,020

(22) Filed: Sep. 24, 2009

(65) Prior Publication Data

US 2010/0015759 A1 Jan. 21, 2010

Related U.S. Application Data

(63) Continuation of application No. 11/735,583, filed on Apr. 16, 2007, now abandoned.

(30) Foreign Application Priority Data

Apr. 18, 2006 (JP) .................................. 2006-113979

(51) Int. Cl.
*B29C 43/18* (2006.01)

(52) U.S. Cl. ................. 264/272.17; 264/275; 264/328.7

(58) Field of Classification Search .................... None
See application file for complete search history.

(56) References Cited

U.S. PATENT DOCUMENTS

| 4,410,469 | A  | * | 10/1983 | Katagiri et al. | ............... 264/1.25 |
| 6,344,162 | B1 | * | 2/2002  | Miyajima       | ................ 264/272.14 |
| 6,743,389 | B2 | * | 6/2004  | Miyajima et al.| ........ 264/272.17 |
| 7,147,447 | B1 | * | 12/2006 | Takahashi      | .......................... 425/89 |
| 7,520,052 | B2 | * | 4/2009  | Takahashi et al.| ............... 29/841 |
| 7,651,887 | B2 | * | 1/2010  | Morita et al.  | .................. 438/106 |

FOREIGN PATENT DOCUMENTS

JP        59096739    *  6/1984

* cited by examiner

*Primary Examiner* — Edmund H. Lee
(74) *Attorney, Agent, or Firm* — Yingsheng Tung; Wade J. Brady, III; Frederick J. Telecky, Jr.

(57) ABSTRACT

The objective of the invention is to prevent electrostatic destruction of semiconductor chips during resin molding. With the semiconductor device manufacturing method, a substrate 400 that includes on the surface multiple semiconductor chips 410 and liquid resin 434 supplied to multiple semiconductor devices is supported by an electrically insulated lower die 200. An upper die 110 in which multiple shape-forming parts (cavities) 112 are formed is pressed against lower die 200 through the medium of a polymer release film 300, and liquid resin 434 on the substrate is molded.

11 Claims, 10 Drawing Sheets

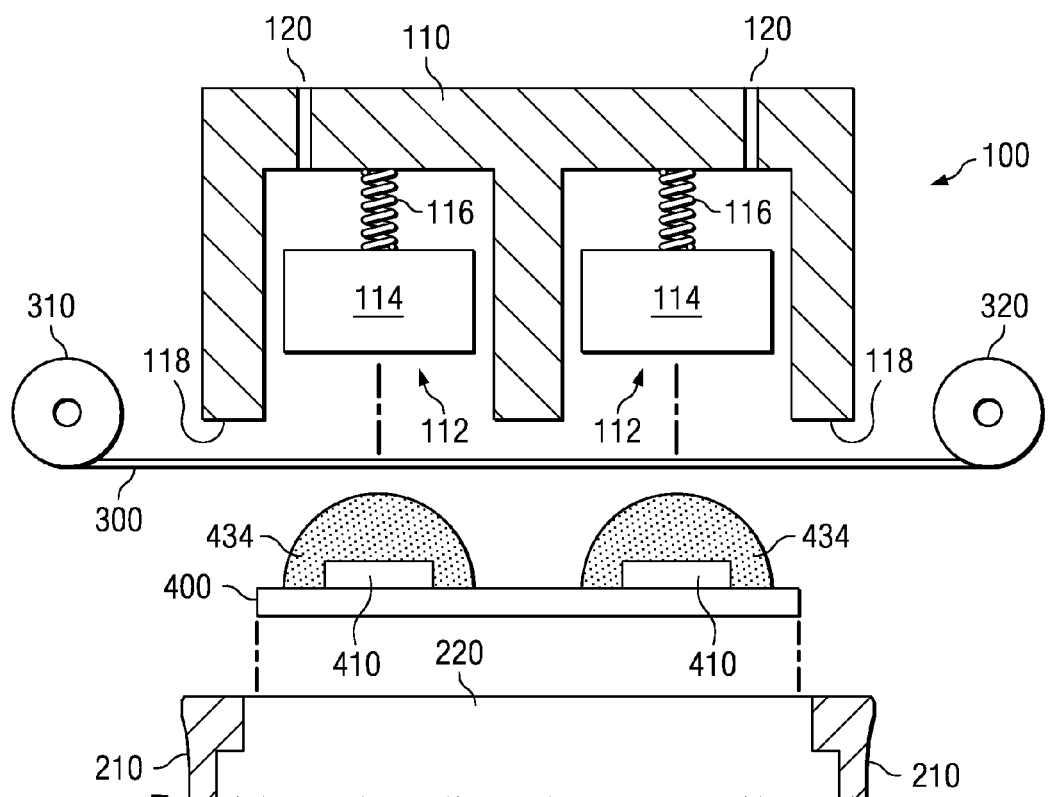
*FIG. 1*
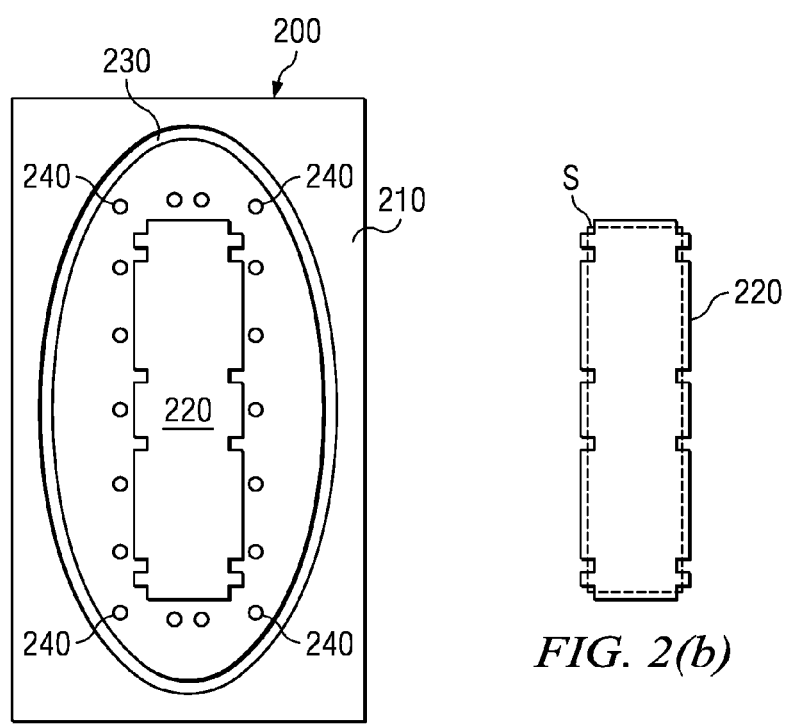
*FIG. 2(a)*
*FIG. 2(b)*

| MATERIAL | | STEEL SAM97 | CERAMIC A-103P |
|---|---|---|---|
| HARDNESS | HRC/HV | 62.5 HRC | 1750HV |
| COEFFICIENT OF THERMAL EXPANSION | mm/°C | $11.1 \times 10^{-6}$ | $8.8 \times 10^{-6}$ |
| THERMAL CONDUCTIVITY | J/cm·sec·°C | 0.25 | 0.33 |
| RESISTIVITY | W cm | $\approx$ ZERO | $1.2 \times 10^{15}$ |
*FIG. 3*
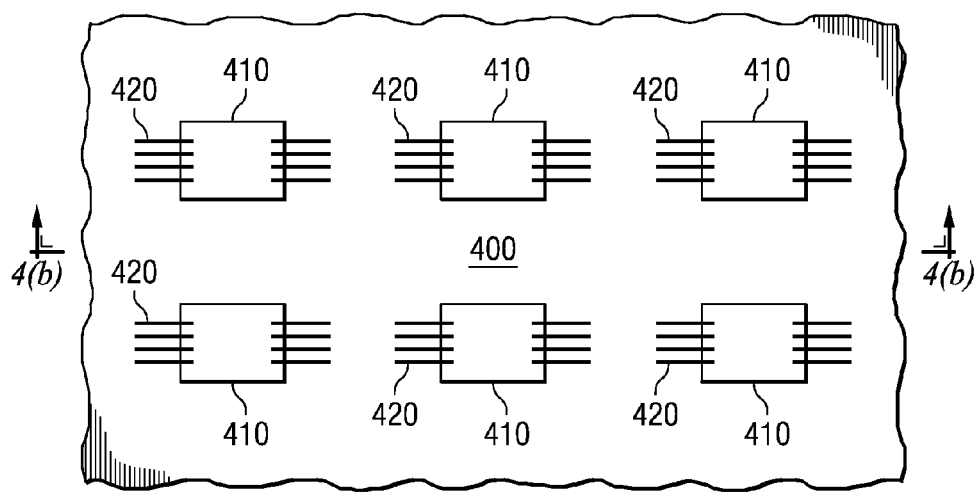
*FIG. 4(a)*
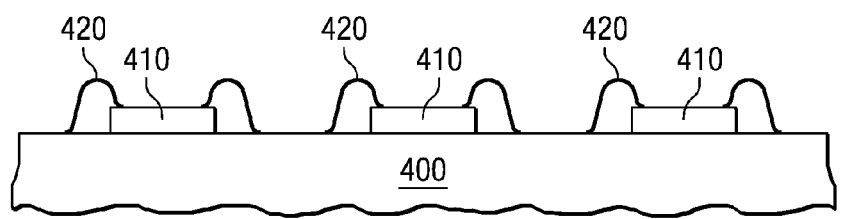
*FIG. 4(b)*

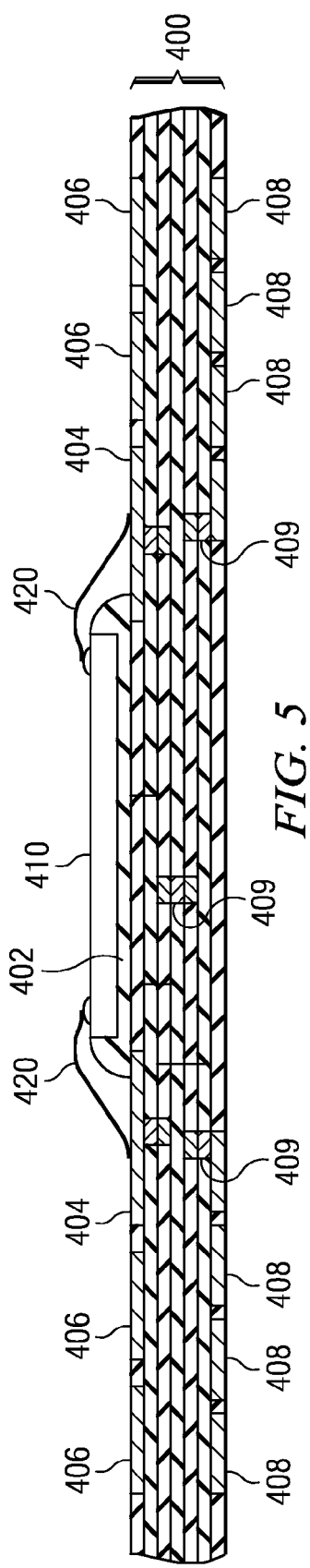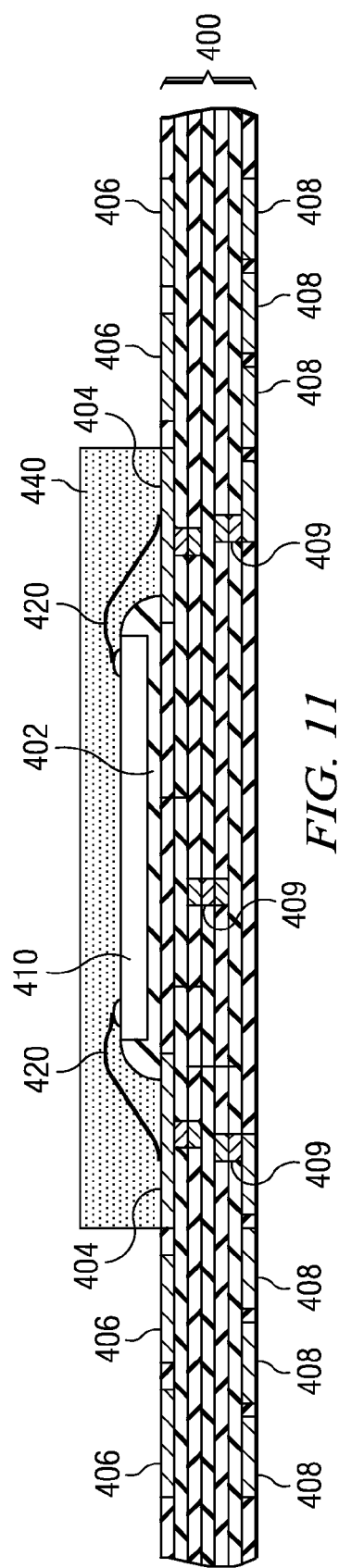

POP SEMICONDUCTOR DEVICE MANUFACTURING METHOD

This is a continuation of application Ser. No. 11/735,583 filed Apr. 16, 2007, now abandoned the contents of which are herein incorporated by reference in its entirety.

FIELD OF THE INVENTION

The present invention relates to a method for resin sealing multiple semiconductor chips mounted on one surface on a substrate, and in particular relates to a semiconductor device manufacturing method and manufacturing device suited to POP (Package on Package).

BACKGROUND OF THE INVENTION

With the spread of mobile telephones, portable computers and other small electronic equipment, the demand for the semiconductor devices mounted on them to be smaller and thinner has increased. BGA packages and CSP packages have been developed and put into use to respond to such demand.

Patent Citation 1 relates to a molding die for resin molding an article to be molded, wherein multiple semiconductor chips are mounted in a matrix form on one surface of a substrate, and a resin molding method using said molding die. FIG. 15(b) illustrates a QFN (Quad Flat Non-leaded) type of semiconductor package. Semiconductor chips 52 are mounted in a matrix form on die pad parts 57 on one surface of lead frame 56, which is the article to be molded. Each semiconductor chip 52 and the peripheral lead part 58 are wire bonded, and the electrode part of semiconductor chip 52 and one surface of lead part 58, which is the terminal connection part, are electrically connected by bonding wire 54. Semiconductor chips 52 mounted in a matrix form are housed in cavity recess 60 when resin substrate 51 or lead frame 56 is mounted in lower mold 59. Resin substrate 51 or lead frame 56 is clamped by upper mold 61 and lower mold 59 at the substrate peripheral edge, cavity recess 60 is filled with mold resin through lower mold runner gate 62, and one surface is resin molded all at once. After resin molding, the molded article (resin substrate 51 or lead frame 56) is diced for individual semiconductor chips, cut into individual pieces, and semiconductor devices are manufactured. (C) is a dice cutter line.

Patent Citation 1
  Japanese Kokai Patent Application No. 2003-234365

FIG. 16 is a figure explaining the semiconductor device molding process used for a conventional POP. In the figure, only one representative semiconductor chip is shown, but multiple semiconductor chips are mounted on substrate 70 and liquid resin is supplied to cover each semiconductor chip. Substrate 70 on which semiconductor chip 72 is mounted is guided by guide pin 76 of lower cavity block (lower die) 74 and is mounted on said block. The material of lower cavity block 74 is steel, and its surface is treated by hard chrome plating. Next, an upper die 80 in which a shape-forming part (recess) 78 is formed is pressed onto lower cavity block 74, and liquid resin on the substrate is molded at or below a constant temperature. In order to improve the releasability of mold resin 82 from upper die 80, a release film 84 is used between upper die 80 and substrate 70. Release film 84 is a plastic, polymer film that is electrically insulating and heat-resistant, and the liquid resin is molded while it is tightly adhered to shape-forming part 78 of upper die 80.

With a multilayer circuit board 70 for the POP, a land 86 is a conductive material such as Cu is formed on the substrate surface. Land 86 is exposed to the outside from mold resin 82, and when another semiconductor substrate is stacked, will be connected to its terminal. Land 86 is also electrically connected to a wiring pad 88, bonding wire 90 or the like in mold resin 82. At the same time, a conductive region 92 of Cu or the like for connecting a terminal, such as a solder ball, is formed on the reverse surface of the substrate. Conductive region 92 on the substrate reverse surface is electrically connected to land 86 or semiconductor chip 72 on the substrate front surface through a via contact in the substrate.

When liquid resin supplied onto the substrate is molded through the medium of release film 84, release film 84 is charged with about 20 KV of static electricity. When upper die 80 is released in this state, the static electricity charged release film 84 is discharged into lower cavity block 74 through semiconductor chip 72, and the integrated circuitry in the semiconductor chip is electrostatically destroyed. That is, release film 84 is touching land 86 exposed at the substrate surface, so the electrostatic charge in release film 84 passes from land 86 through the inside of semiconductor chip 72 via wiring pad 88 and bonding wire 90 in resin 82, again passes through land 86, the via contact in the substrate and conductive region 92 on the substrate reverse surface from bonding wire 90 and flows to lower cavity block 74. Because of this, the circuitry of semiconductor chip 72 maybe destroyed electrostatic discharge. The result is that the semiconductor device yield drops, and reducing the manufacturing cost is difficult.

The present invention solves the aforementioned conventional problems. Its objective is to provide a semiconductor manufacturing device and a semiconductor manufacturing method with which electrostatic destruction of semiconductor chips during molding can be effectively prevented.

SUMMARY OF THE INVENTION

The semiconductor device manufacturing that pertains to the present invention uses mold resin supplied to multiple semiconductor elements mounted on a substrate. A lower die supports the substrate on which multiple semiconductor elements are mounted; and an upper die, through a plastic film, molds the resin for the multiple semiconductor elements mounted on the substrate. The lower die includes an electrically insulated region, which supports the substrate.

The electrically insulated region preferably includes a ceramic member. As for the ceramic member, a ceramic plate attached to the lower die can be used. The ceramic plate is housed in a cavity formed in the lower die, or is attached on the lower die. The ceramic member is made of alumina, for example, but it could also be another ceramic material.

The electrically insulated region may comprise an insulating film arranged on the lower die. As for the insulating film, Teflon (registered trademark), for example, can be used, and it can be attached on the surface of the lower die through the medium of an adhesive.

The electrically insulated region furnished on the lower die is preferably larger than the surface area of the mounted substrate. This may prevent the conductive pathway from the substrate to the lower die.

The lower die preferably includes an O-ring as a sealing member to enclose the electrically insulated region, and the upper die is pressed against the O-ring. Multiple air intake holes are formed in the region encircled by the O-ring, and the resin may be molded in a vacuum state using air intake from the multiple air intake holes.

The upper die preferably includes multiple recesses for molding the resin for the semiconductor elements mounted on the substrate and a suction hole for tightly adhering the plastic film in the multiple recesses. Inside the recesses, an elastic movable member is attached, so that molding may be done with constant pressure applied to the liquid resin in the recesses.

The substrate preferably includes a first principal surface on which semiconductor elements are mounted, a second principal surface opposite the first principal surface, and a first conductive region exposed on the first principal surface, and the first conductive region is electrically connected to semiconductor elements. The first conductive region is exposed to the outside of the mold resin, and when another semiconductor element is stacked, it is connected to the terminals of said other semiconductor element. The substrate includes a second conductive region exposed on the second principal surface, and the second conductive region is electrically connected to the first conductive region and at least one semiconductor element. A terminal, such as a solder ball, is connected to the second conductive region.

The semiconductor device manufacturing method that pertains to the present invention is to manufacture a semiconductor device that has a substrate that includes a first principal surface and a second principal surface opposite the first principal surface, and with which semiconductor elements are resin-molded on the first principal surface. The substrate that contains multiple semiconductor elements and liquid resin supplied for the multiple semiconductor elements on the first principal surface is supported by a lower die so that the second principal surface is electrically insulated. The method includes a step whereby an upper die, in which multiple shape-forming parts are formed, is pressed against the upper die through the medium of a plastic film, and the liquid resin on the substrate is molded by the aforementioned multiple shape-forming parts.

The manufacturing method additionally has a step for separating the upper die from the lower die, and a step for cutting the substrate into individual semiconductor elements. The manufacturing method additionally can include a step for connecting a terminal to the second conductive region exposed on the second principal surface of the substrate, and a step for connecting the terminal of another semiconductor device to the first conductive region exposed on the first principal surface of the substrate when another semiconductor device is stacked.

BRIEF DESCRIPTION OF THE DRAWINGS

FIG. 1 is a figure showing a die structure for molding that pertains to an embodiment of the present invention, FIG. 2: FIG. 2(a) is a plan view showing the schematic of the lower die, and FIG. 2(b) is a schematic plan view of a ceramic plate assembled in the lower die.

FIG. 3 is a table comparing characteristic values of steel and ceramic.

FIG. 4: FIG. 4(a) is a plan view of a substrate on which multiple semiconductor chips are mounted, and FIG. 4(b) is a cross section at line A-A.

FIG. 5 is a cross section showing details of a semiconductor chip and the substrate.

FIG. 11 is a figure showing a cross section of a substrate that has been molded.

REFERENCE NUMERALS AND SYMBOLS AS SHOWN IN THE DRAWINGS

Figure 6:
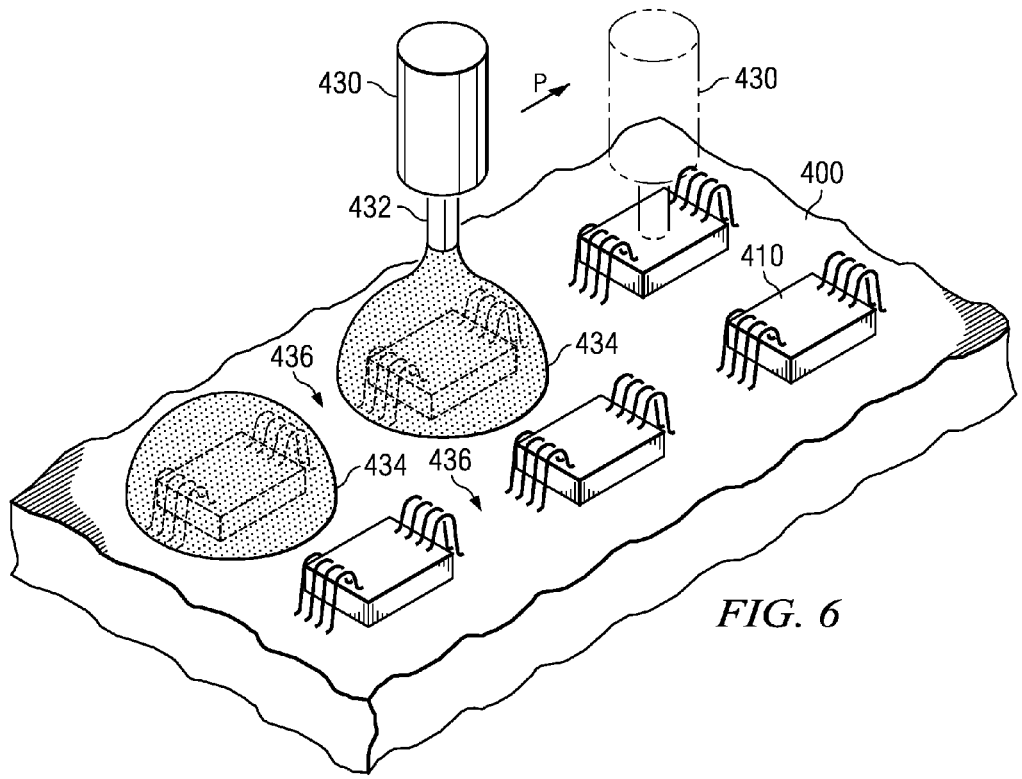
FIG. 6 is a figure that explains supplying liquid resin to semiconductor chips on the substrate.

In the figures, 100 presents a die apparatus; 110 an upper die; 112 a cavity; 114 a pressing member; 116 a spring; 118 a foot part; 120 an air intake hole; 200 a lower die; 210 a die body; 220 a ceramic plate; 230 an O-ring; 240 an air intake hole; 300 a release film; 310, 320 reels; 400 a multilayer circuit board; 402 a die attach; 404 a copper pattern; 406 a land; 408 a copper pattern; 409 a via contact; 410 a semiconductor chip; 420 a bonding wire; 430 a supply part; 432 a nozzle; and 434 a liquid resin.

DESCRIPTION OF THE EMBODIMENTS

With the present invention, the lower die supports the substrate through the medium of an electrically insulated region, to hinder conduction of the charge in the plastic film to the lower die through the substrate, so electrostatic destruction of circuitry in the semiconductor chips on the substrate is suppressed. The semiconductor device manufacturing yield can be improved and the manufacturing cost can be reduced because of this.

Below, embodiments of the present invention are explained in detail by referring to figures.

FIG. 1 shows the die apparatus for molding that pertains to an embodiment of the present invention. Die apparatus 100 includes an upper die 110, a lower die 200 and a release film 300, and molds semiconductor chips mounted on a substrate all at once and individually.

Upper die 110 is made of metal, for example, and multiple recesses, that is, cavities 112 are formed in the pressing surface of upper die 110. These cavities 112 correspond in number and position to the semiconductor chips disposed on the substrate. Inside each cavity 112, a rectangular shaped pressing member 114 is housed, and pressing member 114 is elastically supported by a spring 116. Cavity 112 is a rectangular depression (recess) enclosed by the side surfaces of foot part 118 of the upper die and the pressing surface of pressing member 114 and regulates the external shape of the mold resin that is molded. The dimensions of cavity 112 enclosed by the side surfaces of foot part 118 and the pressing surface of pressing member 114 are, for example, 10.9 mm width, 10.9 mm depth, and 0.27 mm height.

Additionally, in upper die 110, an air intake hole 120 connected to each cavity 112 is formed. By intaking air from this air intake hole 120, release film 300 is sucked or tightly adhered to follow the pressing surface of cavity 112 of upper die 110.

Lower die 200 includes a metallic die body 210, and a ceramic plate 220 housed in a cavity (void) formed in die body 210. Ceramic plate 220 is incorporated in die body 210 to form the same plane as the surface of die body 210. Ceramic plate 220 preferably provides a mounting surface equal to or greater than that of the mounted substrate, and contacts the substrate reverse surface. Ceramic plate 220 is made of alumina, for example, and has a thickness of around 5 mm.

Release film 300 is supplied from a reel 310 and is taken up by a reel 320. Release film 300 has plasticity and heat resistance, and it is desirable for it to have the property of softening at a lower temperature than the temperature of upper die 110, which is heated. With this embodiment, upper die 110 is heated to about 150 degrees, so the softening temperature of release film 300 is selected to be near 150 degrees. For example, a thermoplastic fluorine resin (ETFE) plastic film can be used.

FIG. 2(*a*) is a schematic plan view of the lower die, and FIG. 2(*b*) is a schematic plan view of the ceramic plate. As for lower die 200, as shown in the figure, an elliptical O-ring 230 is attached outside the periphery of ceramic plate 220. Multiple air intake holes 240 are formed in the region inside O-ring 230 of die body 210. As for air intake holes 240, air is taken in by a vacuum apparatus, which is not shown, and when upper die 110 contacts O-ring 230, the space formed by upper die 110 and lower die 200 becomes a vacuum, and the liquid resin can be molded in a vacuum state.

Ceramic plate 220 is worked to a shape matching the void (cavity) formed in die body 210. As shown in FIG. 2(*b*), when the mounted substrate is rectangular with surface area (S) (indicated by the broken line), ceramic plate 220 is essentially the same size as rectangular surface area (S). The size and shape of ceramic plate 220 can be appropriately changed according to the shape of the mounted substrate, the size or position of the copper pattern formed on the reverse surface of the substrate, etc. In other words, the relationship may be such that the mounted substrate is electrically insulated from die body 210.

Die apparatus 100 in this embodiment differs from conventional lower dies in this way, and the fact that a ceramic plate 220 is incorporated into the lower die is one of its features. FIG. 3 is a table comparing the characteristics of steel used for conventional lower dies and the ceramic used for this embodiment. Ceramic is harder than steel; and has a higher electrical resistivity. FIG. 3 lists the electrical resistivity of the alumina ceramic ($Al_2O_3$) at 25° C. at $1 \times 10^{14}$ (Ωcm) or greater, and that of Teflon (PTFE) at $1 \times 10^{16}$ (Ωcm) or greater.

Next, the substrate that is molded is explained. FIG. 4(*a*) is a plan view of a substrate on which multiple semiconductor chips are mounted, and FIG. 4(*b*) is a cross section thereof at line A-A. With this embodiment, multiple semiconductor chips are disposed in a matrix form on one surface of a substrate 400. The constitution is not specifically restricted, and a multilayer circuit board or film substrate can be used for substrate 400. For example, an insulated substrate of glass epoxy resin, polyimide resin or the like can be used. Semiconductor chips 410 are attached at prescribed positions on substrate 400. The electrodes of semiconductor chips 410 are connected to a copper pattern formed on the front surface of substrate 400 by bonding wires 420.

FIG. 5 is a cross section showing details of the semiconductor chips and the substrate. Here, for convenience, an example wherein one semiconductor chip is mounted on a substrate is shown. Substrate 400 is a multilayer circuit board 0.3 mm thick, and semiconductor chip 410 is attached to the surface of multilayer circuit board 400 through the medium of a die attach 402. The dimensions of semiconductor chip 410 are, for example, 8.8 mm width, 8.6 mm depth and 0.1 mm height.

Electrodes formed on the surface of semiconductor chip 410 are connected to copper pattern 404 on the multilayer circuit board by bonding wires 420. In addition, multiple lands 406 electrically connected to copper pattern 404 are formed on the surface of multilayer circuit board 400. Lands 406 could also be formed by extending copper pattern 404, for example. Lands 406 are connecting electrodes, such as solder balls, of other semiconductor devices when said other semiconductor devices are laminated onto multilayer circuit board 400.

On the reverse surface of multilayer circuit board 400, multiple copper patterns 408 are formed for connecting terminals, such as solder balls, for surface packaging. Copper patterns 408 are electrically connected to a copper pattern 404 or land 406 on the corresponding substrate surface by a via contact 409 formed between multilayer circuit boards.

Liquid resin is supplied onto a substrate such as this on which semiconductor chips are mounted. As shown in FIG. 6, a supply part 430 filled with liquid resin scans in the length direction (P) of substrate 400 and supplies liquid resin 434 onto substrate 400 from a nozzle 432 at the tip. In this case, liquid resin 434 is intermittently supplied to cover the surface of individual semiconductor chips 410. Because of this, liquid resin 434 is not supplied to regions 436 adjacent to semiconductor chips 410 and the substrate is exposed in regions 436. The amount of liquid resin 434 supplied controls the dimensional precision of the mold resin, so it must be controlled very precisely. Liquid resin 434 is preferably supplied in a range ±3% of the volume of cavity 112 of upper die 110 described above.

A characteristic of liquid resin 434 is that it is liquid at room temperature, and its viscosity is about 30-150 Pascal seconds [Pa s]. 45 Pascal seconds is more desirable. By causing liquid resin 434 to have a fixed viscosity, liquid resin 434 supplied from the nozzle can ideally cover all of semiconductor chip 410. For liquid resin 434, epoxy resin, for example, can be used, and it may also be quick drying.

Figure 7:
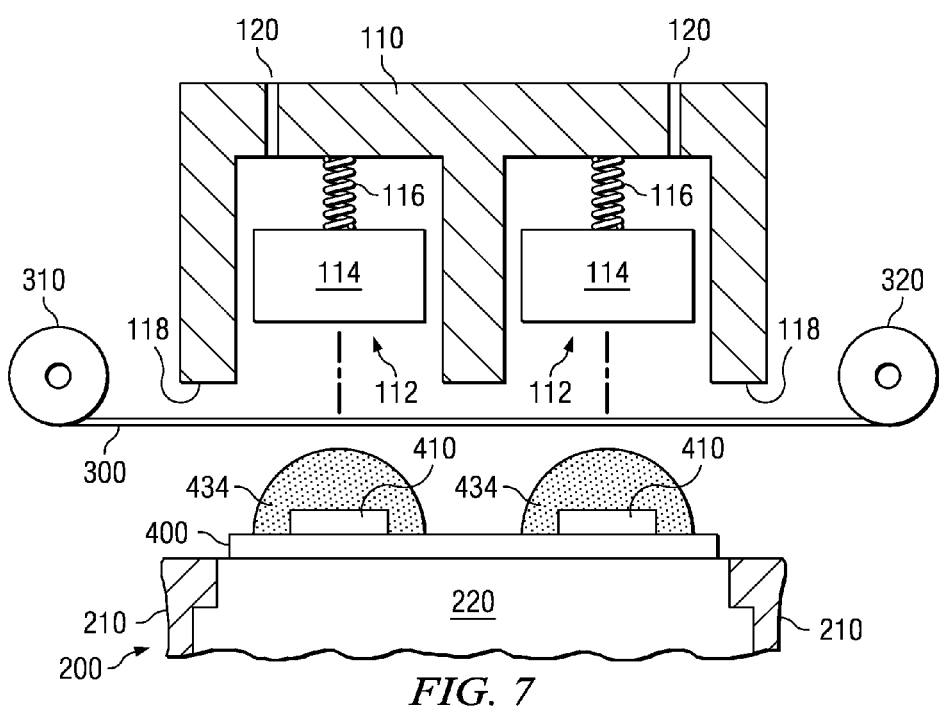
FIG. 7 is a figure showing the molding process using the die apparatus that pertains to an embodiment of the present invention.

Next, the molding process using the die apparatus in this embodiment is explained. First, as shown in FIG. 7, substrate 400 is placed on lower die 200. Substrate 400 is disposed on ceramic plate 220 that has a mounting surface larger than substrate 400. Substrate 400 is electrically insulated from lower die 200 by this. Multiple air intake holes 240 (refer to FIG. 2) as described above are formed in lower die 200, and the reverse surface of substrate 400 can also be held by suction onto ceramic plate 220 by air intake holes 240. Here, with this embodiment, substrate 400 with which liquid resin 434 has been supplied onto semiconductor chips 410 is placed on lower die 200, but this is not necessary, and liquid resin could also be supplied onto semiconductor chips 410 while resin 400 is in place on lower die 200.

Next, release film 300 is supplied from reel 310. It is desirable that release film 300 have a thickness of at least around 50 μm. This is so that during molding of liquid resin 434, as described below, when release film 300 is pressed onto substrate 400 by foot part 118 of the upper die, liquid resin 434 will not be forced outside the contact surface between release film 300 and substrate 400. A copper pattern and solder resist are also formed on the surface of substrate 400, and since their level difference from the substrate surface is about 20 μm, it is desirable that the thickness of release film 300 be selected to be 50 μm or greater so that this level difference can be covered. Even more preferably, roughening is applied to one surface of release film 300. The roughening is, for example, Rz:15 μm. The surface to which roughening is applied is contacted with upper die 110. Release film 300 is easily separated from upper die 110 after molding of the liquid resin because of this, and is taken up by reel 320.

Figure 8:
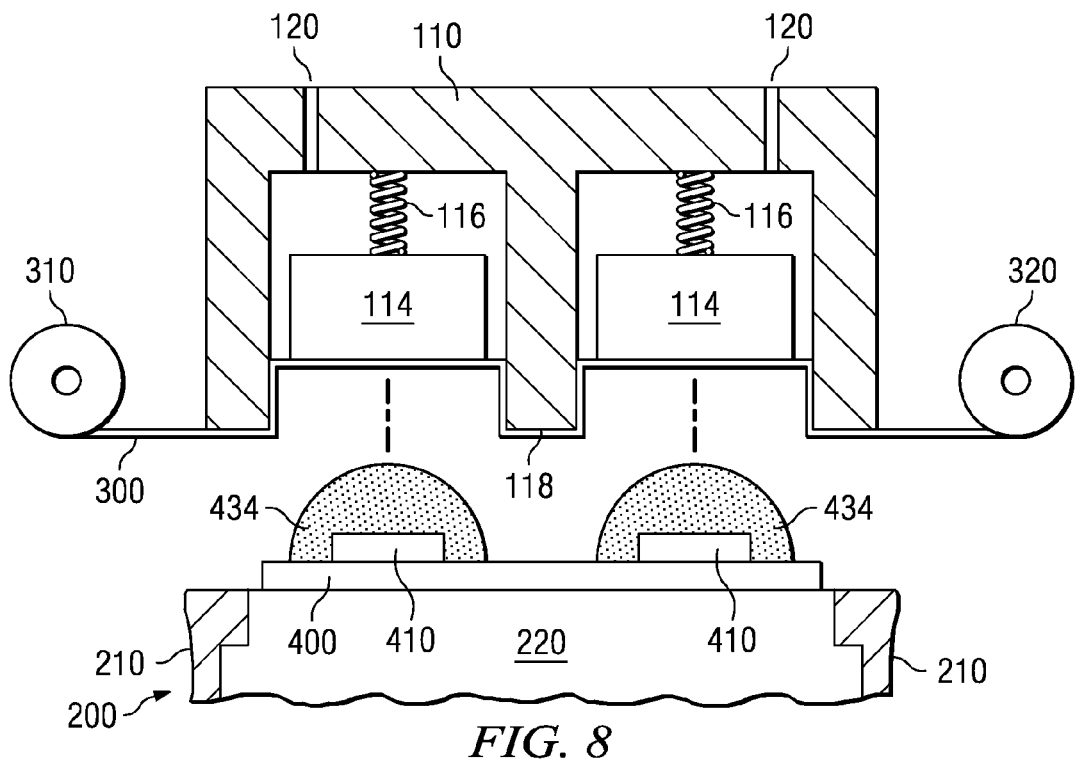
FIG. 8 is a figure showing the molding process using the die apparatus that pertains to an embodiment of the present invention.

Next, as shown in FIG. 8, release film 300 is tightly adhered to follow the cavities in the upper die by suctioning air through air intake holes 120 furnished in upper die 110. In addition, upper die 110 is brought close to lower die 200. When it approaches at a fixed distance, upper die 110 touches the O-ring, which is not shown, in lower die 200, the air in the cavities is discharged, and a vacuum is produced inside the cavities. It is desirable that the absolute degree of vacuum be 5 kilopascals [kPa] or greater. Upper die 110 and lower die 200 are heated to about 150 degrees.

Figure 9:
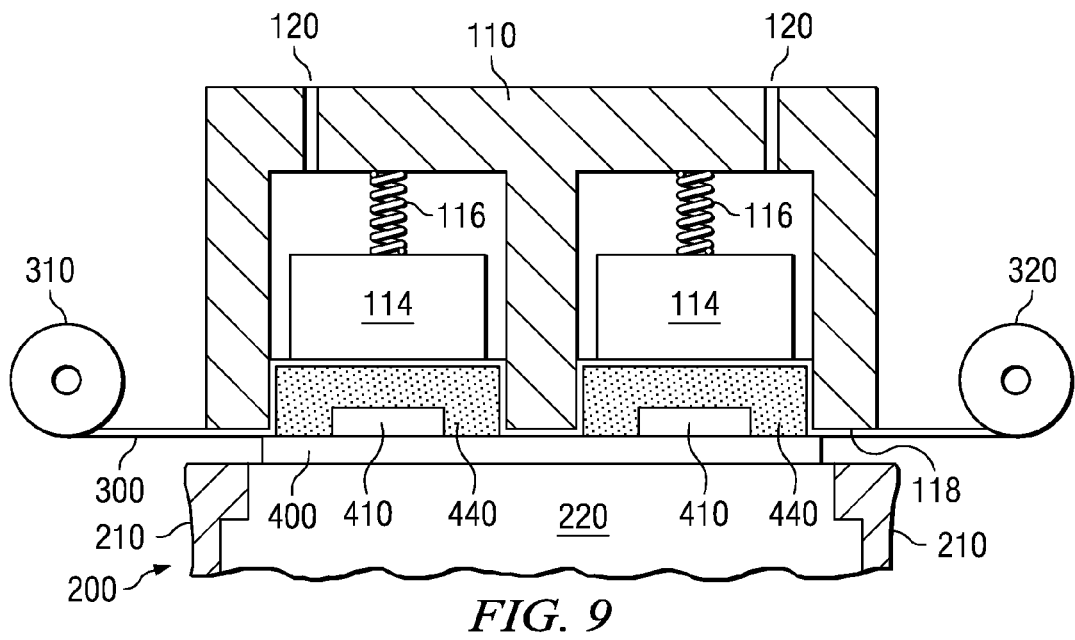
FIG. 9 is a figure showing the molding process using the die apparatus that pertains to an embodiment of the present invention.

Next, as shown in FIG. 9, upper die 110 is lowered and its foot parts 118 contact substrate 400 at a fixed pressure. A sealed space is formed in the region that includes individual semiconductor chips on the substrate by this. Pressing member 114 in each cavity 112 compression molds the liquid resin elastically through the medium of release film 300, and this state is maintained for about 100 seconds. During this period, since foot parts 118 are touching substrate 400 with a fixed pressure, liquid resin is not forced outside cavities 112. In this way, mold resin 440 in a shape reflecting the shape of cavity 112 is molded by compression molding of the liquid resin at a fixed temperature.

Figure 10:
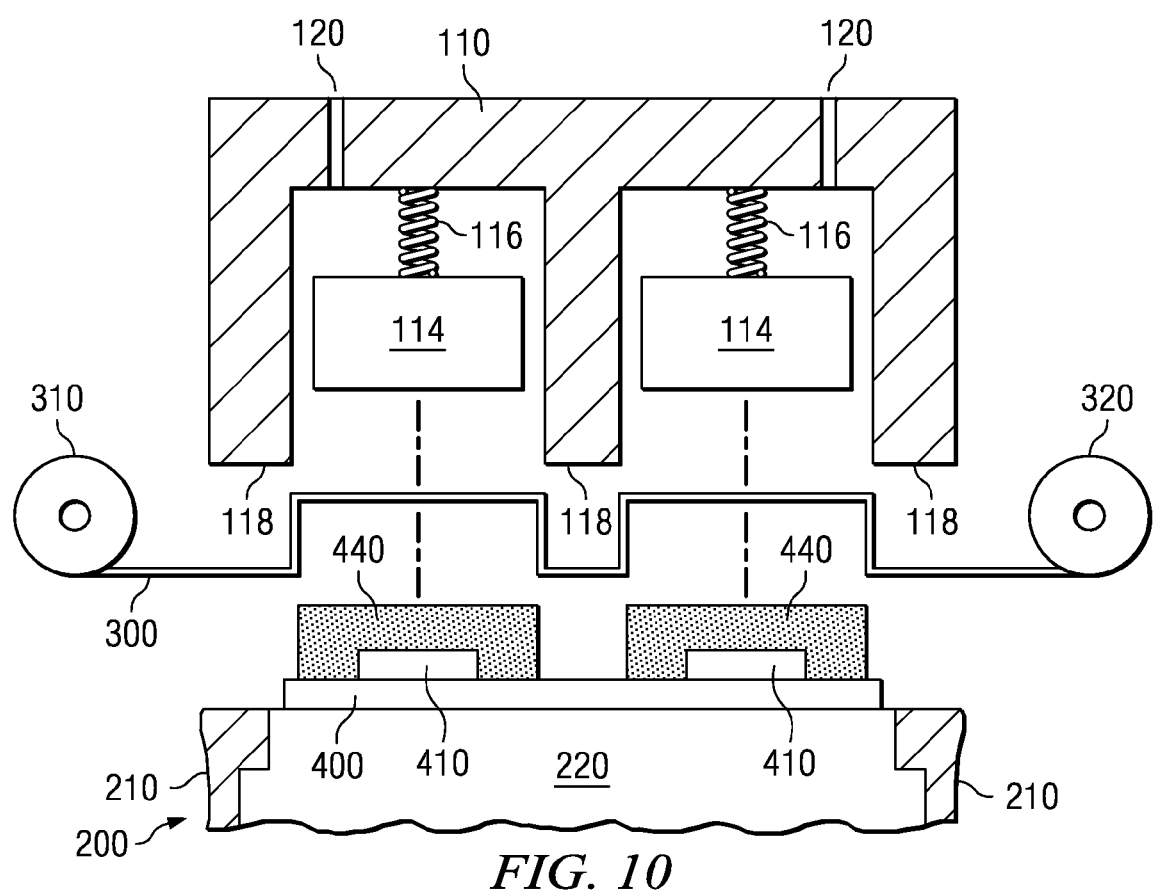
FIG. 10 is a figure showing the molding process using the die apparatus that pertains to an embodiment of the present invention.

Next, as shown in FIG. 10, upper die 110 is released from lower die 200. Release film 300 is separated from the pressing surface of upper die 110 and is taken up on reel 320. At the same time, mold resin 440 on the substrate is separated from release film 300. Mold resin 440 in a number corresponding to the number of semiconductor chips is formed on substrate 400.

FIG. 11 shows a cross section of a substrate that has been molded. Mold resin 440 seals a region including semiconductor chip 410, bonding wire 420 and copper pattern 404 to which the bonding wire is connected. Here, multiple lands 406 on the substrate connect to the terminals of other semiconductor devices that are stacked, so they are not sealed by mold resin 440 and remain exposed.

When upper die 110 is separated from lower die 200, release film 300 is electrically charged at about 20 kv. When release film 300 is separated from substrate 400 or lands 406, since substrate 400 is electrically insulated from lower die 200, a current pathway from release film 300 to lower die 200 is cut off. That is, current does not flow from release film 300 through lands 406, copper patterns 404, bonding wires 420, semiconductor chips 410, via contacts 409, copper patterns 408 on the substrate reverse surface, or die body 210. Electrostatic destruction of the internal circuitry of semiconductor chip 410 by the static electricity in release film 300 can be prevented by this.

Figure 12A:
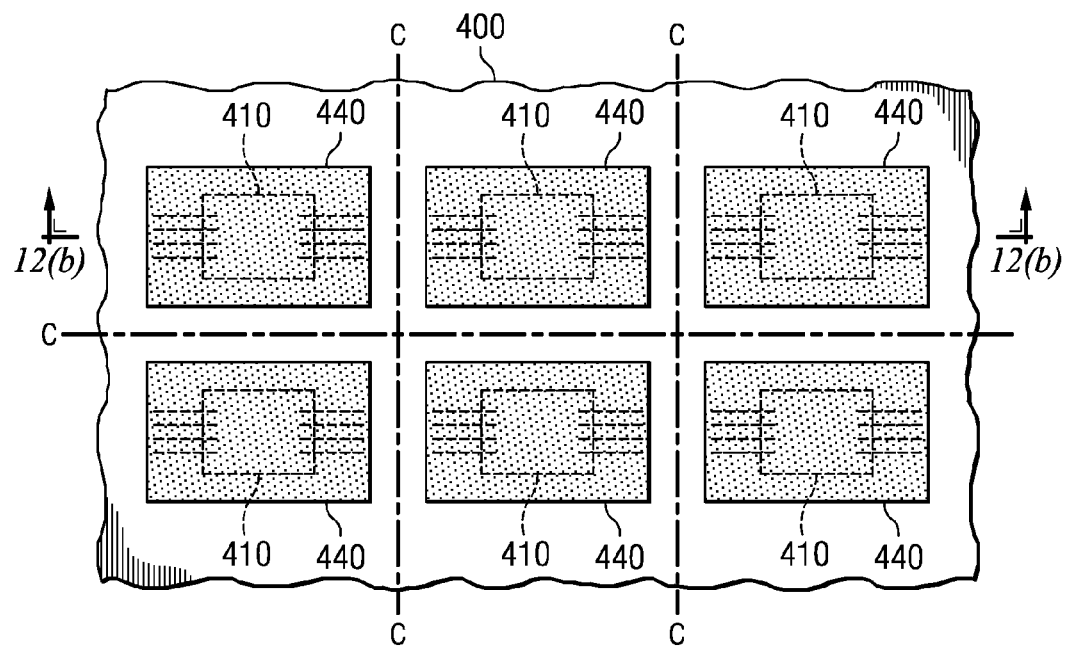
FIG. 12: Figure (a) is a plan view of a substrate on which mold resin is formed, and Figure (b) is a cross section at A1-A1.
Figure 12B:
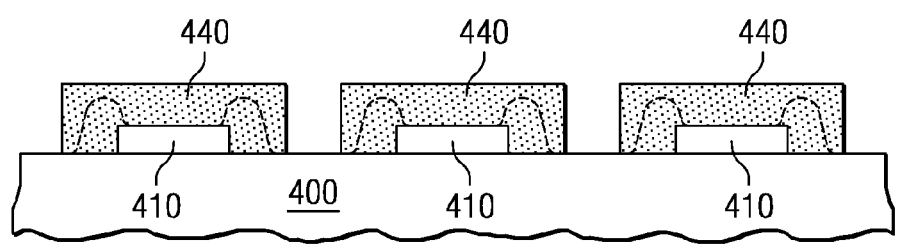

Next, as shown in FIG. 12, substrate 400 is removed from lower die 200. Mold resin 440 that is very thin and occupies a small surface area sealing semiconductor chips 410 is formed on substrate 400. As subsequent processes, the process of connecting a solder ball as a connection terminal to copper pattern 408 on the reverse surface of substrate 400, and the process of dicing substrate 400 are performed. With the dicing process, the substrate is cut along dicing lines (C) established between a mold resin 440 and a mold resin 440.

Since mold resin 440 is not cut, the external shape of mold resin 440 can be left in a shape reflecting the shape of the cavity, and the occurrence of particles, cracking of the mold resin, etc. is controlled.

Figure 13A:
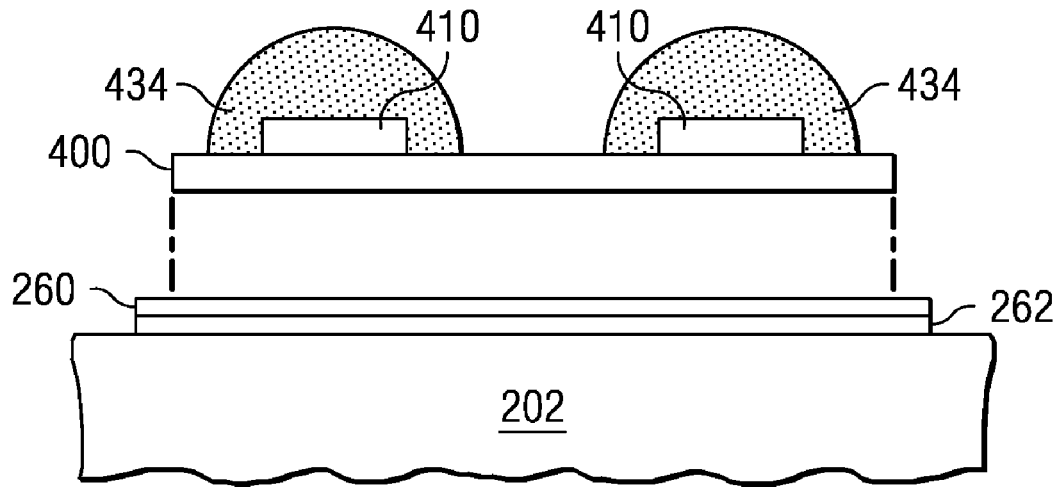
FIG. 13(a) shows a lower die based on another embodiment of the present invention.

Next, a second embodiment of the present invention will be explained. With the aforementioned embodiment, a ceramic plate was attached to lower die 200, but with the second embodiment, as shown in FIG. 13(a), an insulating film 260 is adhered on lower die 202. As insulating film 260, Teflon (registered trademark), for example, can be used, and it is stuck onto the surface of lower die 202 using an adhesive 262. The thickness of insulating film 260 is preferably about 25 μm.

Insulating film 260 is set at a size and shape with which substrate 400 can be electrically insulated from lower die 202. Here, for lower die 202, in addition to using steel that is hard coated by using the first example, for example, chrome could be formed on a ceramic plate.

Figure 13B:
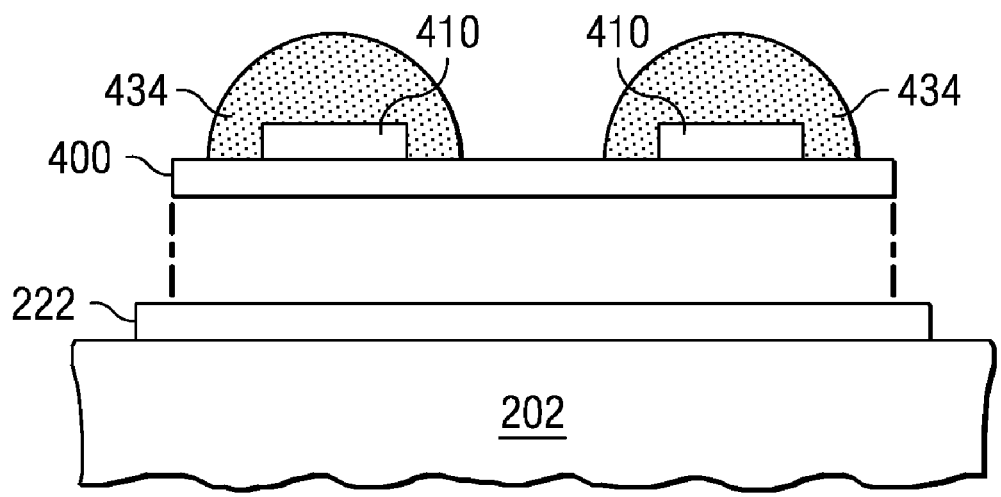
FIG. 13(b) shows a lower die based on another embodiment of the present invention.

With the first embodiment, a ceramic plate was inserted into the cavity in the lower mold, but this is not necessary, and a ceramic plate 222 or ceramic block 222 could also be disposed on the surface of die body 202, as shown in FIG. 13(b).

Figure 14:
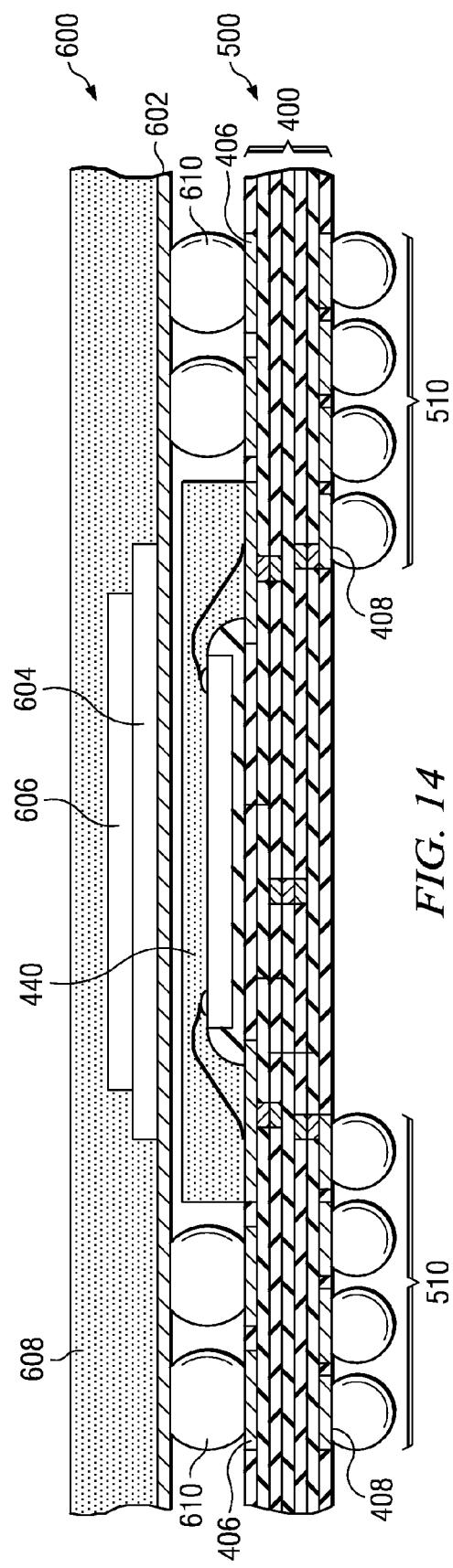
FIG. 14 is a schematic cross section showing a semiconductor device stacked structure (POP).
Figure 15A:
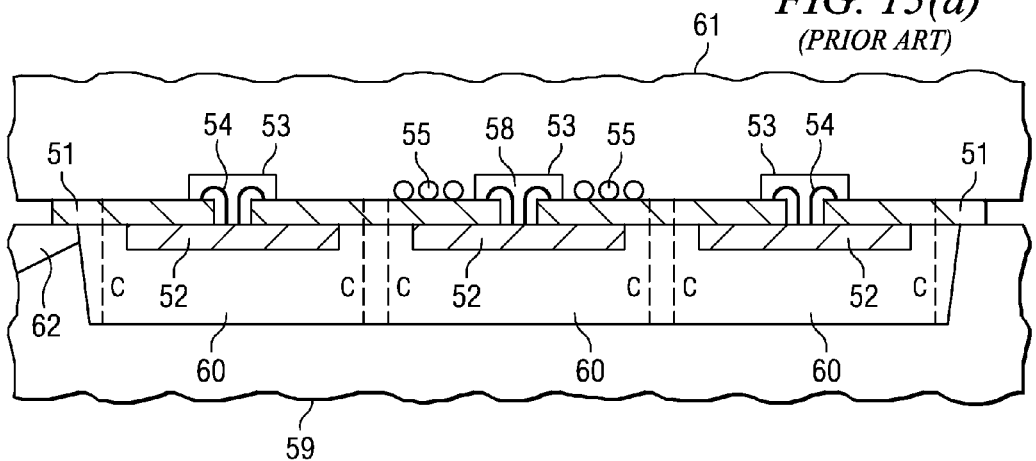
FIG. 15 is a figure explaining a conventional matrix substrate molding method.
Figure 15B:
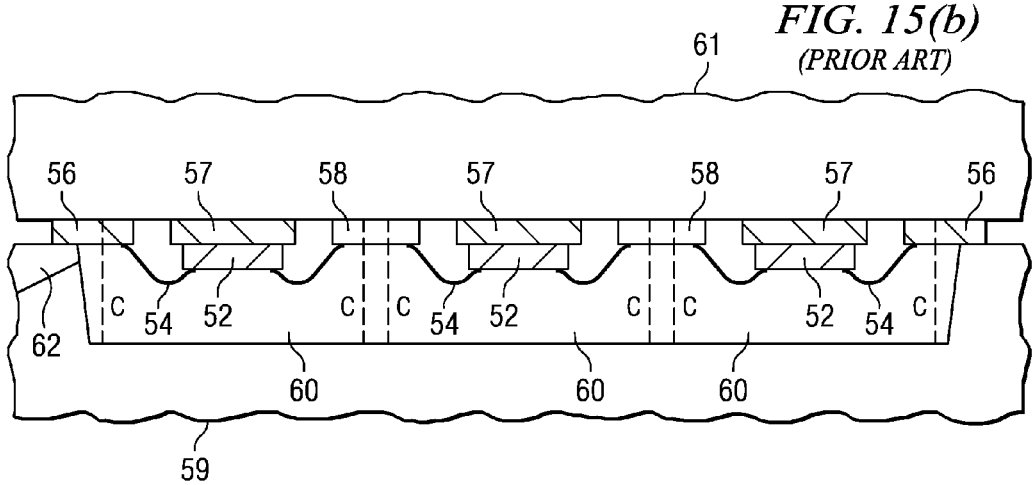
Figure 16:
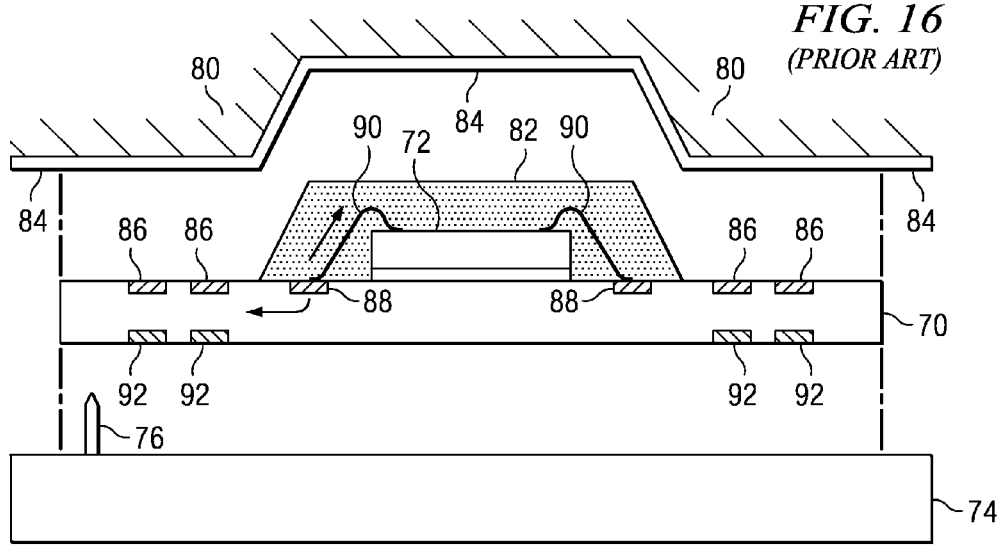
FIG. 16 is figure explaining problems in conventional semiconductor device molding methods.

Next, a third embodiment of the present invention will be explained. FIG. 14 is a cross section showing a POP (Package on Package) structure wherein a second semiconductor device is stacked on a first semiconductor device formed using the molding method based on the first embodiment.

First semiconductor device 500 has a BGA package provided with a multilayer circuit board 400 0.3 mm thick, multiple solder balls 510 0.23 mm thick formed on the reverse surface of multilayer circuit board 400, and mold resin 440 formed on the top surface of multilayer circuit board 400. Solder balls 510 are connected to copper patterns 408 formed on the reverse surface of substrate 400. Semiconductor chips and bonding wires are sealed inside by mold resin 440. The loop length of a bonding wire from the chip surface is about 0.05 mm, the distance from a bonding wire to the mold resin surface is about 0.095 mm, and the height of the entire package of the first semiconductor device is 0.8 mm.

A second semiconductor device 600 is stacked on first semiconductor device 500. As for second semiconductor device 600, semiconductor chips 604 and 606 are stacked on the top surface of a substrate 602, and semiconductor chips 604 and 606 are sealed by mold resin 608. Mold resin 608 may be made using transfer molding. Two rows of solder balls 610 in 4 directions are formed on the reverse surface of substrate 602.

When second semiconductor device 600 is stacked on first semiconductor substrate 500, solder balls 610 are disposed to enclose mold resin 440 and are connected to the lands 406 exposed on the top surface of substrate 400 of first semiconductor device 500. The height of mold resin 440 from the surface of substrate 400 is about 270 μm, and the height of solder balls 610 from substrate 602 is somewhat greater than that. A slight gap is formed between the reverse surface of substrate 602 and mold resin 440 because of this.

An extremely thin, small first semiconductor device 500 is formed using the molding method pertaining to the first embodiment, and a thin POP structure can be obtained by stacking a second semiconductor device 600 on it.

Preferred embodiments of the present invention were described in detail, but the invention is not limited to the specific embodiments pertaining to the present invention, and various modifications and changes are possible within the scope of the main points of the present invention described in the claims.

With the abovementioned embodiments, a BGA or CSP type semiconductor device manufacturing method was shown, but of course, these could be other semiconductor devices. The package configuration is not specifically limited as long as a semiconductor chip mounted on one surface of a substrate is resin sealed. In addition, the method of packaging semiconductor chips on the substrate, in addition to connections using wire bonding, could also involve face down connections or the like. In addition, the cavities formed in the upper die were rectangular, but the side surfaces of the cavities could also be slanted so that the side surfaces of the resin mold slant.

The die apparatus that pertains to the present invention can be used for resin molding of semiconductor devices that are ultra-small, ultra-thin, and have stable dimensional precision.

What is claimed is:

1. A method for manufacturing a semiconductor device, comprising:
    placing nonbindingly a substrate having a semiconductor chip affixed thereto on a surface of a ceramic inlay, which electrically insulates metallic portions of the substrate from metallic portions of a lower die, and wherein the metallic portions of the substrate are electrically communicative with the semiconductor chip;
    dispensing a liquid resin covering the semiconductor chip; and
    solidifying the liquid resin.

2. The method of claim 1, in which the ceramic inlay is an integral portion of the lower die.

3. The method of claim 2, in which the bottom die has an o-ring inlaid in a surface of the bottom die.

4. The method of claim 3, in which a polymeric sheet covers a surface of a top mold die facing the substrate.

5. The method of claim 1, further comprising reducing the volume of a cavity containing the liquid resin and the semiconductor chip until the liquid resin fills the cavity by lowering a pressing member attached to a spring.

6. The method of claim 1, in which the substrate has a plurality of semiconductor chips affixed thereto.

7. The method of claim 6, in which the plurality of semiconductor chips include a plurality of stacks of chips.

8. The method of claim 6, further comprising severing the substrate thereby singulating the plurality of semiconductor chips.

9. The method of claim 8, further comprising connecting the severed substrate with metal members to a second semiconductor device.

10. The method of claim 9, in which the second semiconductor device include a semiconductor chip.

11. The method of claim 9, in which the second semiconductor device include a stack of semiconductor chips.

* * * * *